United States Patent [19]

Takeuchi et al.

[11] Patent Number: 4,609,937
[45] Date of Patent: Sep. 2, 1986

[54] POWER SEMICONDUCTOR DEVICE WITH O-RING SEAL

[76] Inventors: Minami Takeuchi, 3-19-6, Fujimidai, Nerima-ku, Tokyo; Shuichi Otake, 2-16-9, Miyoshi, Koto-ku, Tokyo, both of Japan

[21] Appl. No.: 726,943

[22] Filed: Apr. 26, 1985

Related U.S. Application Data

[63] Continuation of Ser. No. 381,763, May 25, 1982.

[30] Foreign Application Priority Data

May 28, 1981 [JP] Japan .................................. 56-81730

[51] Int. Cl.[4] ................. H01L 23/48; H01L 23/02; H01L 23/32
[52] U.S. Cl. ................................ 357/79; 357/75; 357/76; 357/77; 174/52 S
[58] Field of Search .................... 357/79, 75, 76, 77; 174/52 S

[56] References Cited

U.S. PATENT DOCUMENTS

| 3,435,304 | 3/1969 | Bezouska et al. | 357/79 |
| 3,437,887 | 4/1969 | Norwalk et al. | 357/79 |
| 3,447,118 | 5/1969 | Ferree | 357/76 |
| 4,301,465 | 11/1981 | Masselin | 357/79 |
| 4,302,767 | 11/1981 | Eisele | 357/75 |
| 4,499,485 | 2/1985 | Schierz et al. | 357/76 |

FOREIGN PATENT DOCUMENTS

| 2049571 | 4/1972 | Fed. Rep. of Germany | 357/79 |
| 2341945 | 2/1977 | France . | |

Primary Examiner—Andrew J. James
Assistant Examiner—Jerome Jackson
Attorney, Agent, or Firm—Finnegan, Henderson, Farabow, Garrett & Dunner

[57] ABSTRACT

A power semiconductor device dispensed with soldering and useful for fork lifts and etc., wherein at least one O-ring is provided between the inner wall of case housing at least one semiconductor element structure and outer periphery of a member disposed on the semiconductor element structure inside said case so as to hermetically seal the semiconductor element structure from external atmosphere.

11 Claims, 11 Drawing Figures

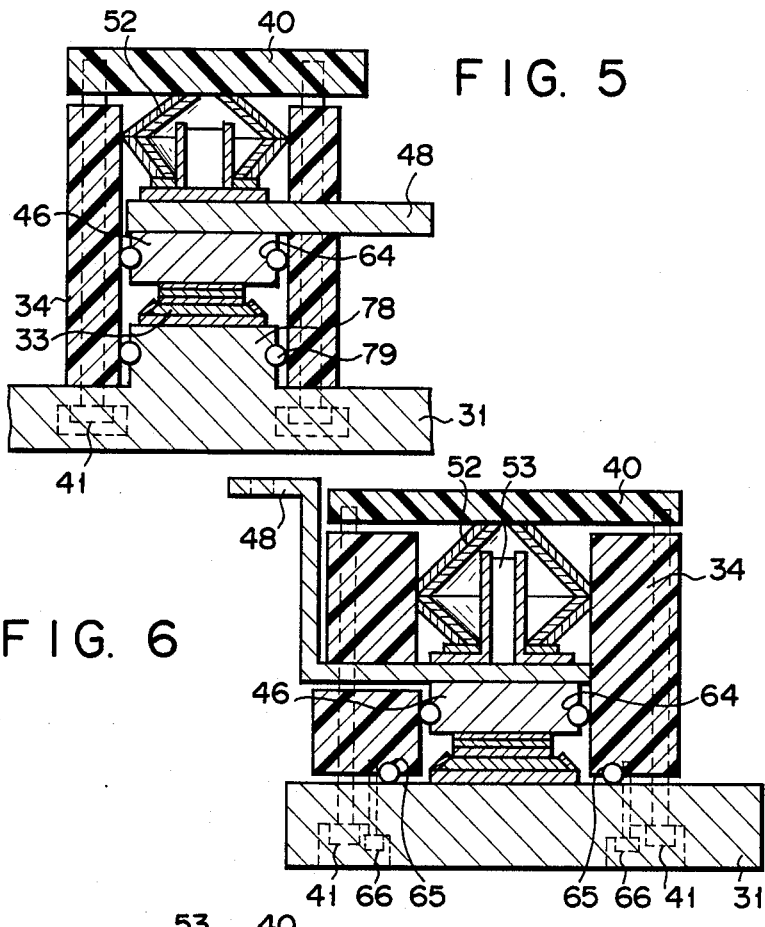
FIG. 5
FIG. 6
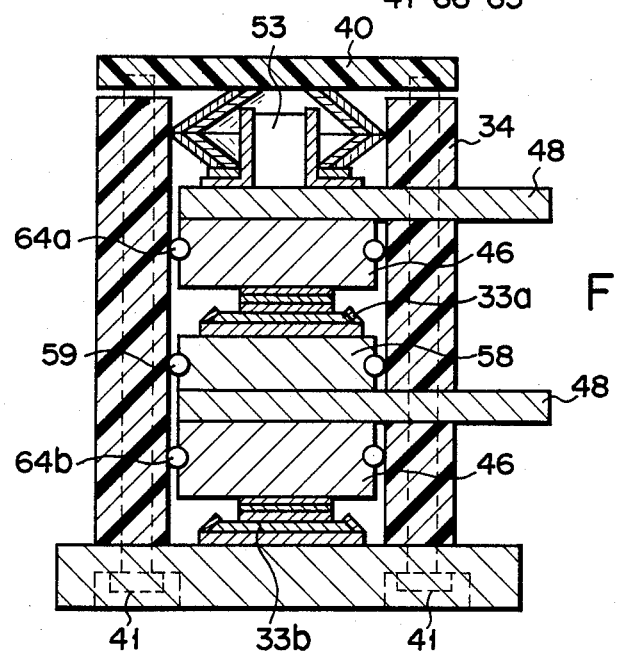
FIG. 7

POWER SEMICONDUCTOR DEVICE WITH O-RING SEAL

This application is a continuation of application Ser. No. 381,763, filed May 25, 1982.

BACKGROUND OF THE INVENTION

This invention relates to power semiconductor devices, the hermetical seal of which is improved.

Power semiconductor devices for rectifiers or the like used for fork lifts and electric cars generally have high current capacities and, therefore, require large element areas. Thermal fatigue of soldered portions of electrodes and breakage of bonding wires due to fusion are common occurrences in such devices. Desirably, these devices are made without resorting to soldering or bonding. In addition, these devices should desirably have a flat top surface for various parts which have to be mounted thereon. Furthermore, a hermetic seal is required to prevent water from intruding into the inner element section when washing the vehicle.

A highly reliable and safe design is thus required for the power semiconductor device.

To meet these requirements, there has been proposed a construction as shown in FIGS. 1 and 2. The construction is free from soldering and bonding and uses a spring member which is held in a compression bonded state. It has a flat top surface, and an electrode is adapted to be taken out in a lateral direction. Furthermore, a hermetic seal of the inside is ensured by using O-rings. More particularly, referring to FIGS. 1 and 2, an aluminum support plate 2, which also serves as a heat radiator, supports a compression bonding type semiconductor element 4, such as a diode, such that its anode electrode 3 is in contact with the top of the support plate 2. The aluminum support plate 2 also supports a case 5 made of a resin such that it is open at both its upper and lower ends. The case 5 surrounds the semiconductor element 4. A cover plate 6 seals the top opening of the case 5. The aluminum support plate 2, case 5 and cover plate 6 are secured to one another by suitable securing means such as a plurality of screws 7. At least either one of the confronting surfaces of the case 5 and cover plate 6, for instance the confronting surface of the case 5, is provided with a groove surrounding the open top. An O-ring 9, which is made of an elastic insulator, is received in the groove 8 and compressed by the cover plate 6. The interior of the case 5 is thus hermetically sealed.

The aluminum support plate 2 is provided with recesses 10 so that the screws 7 will not project from the support plate 2. An electrode body 13 is disposed over the cathode electrode 11 of the semiconductor element 4. It is mounted on the semiconductor element via a metal support 12 made of molybdenum or tungsten having substantially the same coefficient of thermal expansion as that of the semiconductor material, for instance silicon, in order to prevent cracking of the element 3 due to thermal fatigue.

On the electrode body 13 is provided one end of a cathode lead electrode 15, which has its other end extending through a hole 14 formed in a side wall of the case 5. On the end portion of the cathode lead electrode 15 over the semiconductor element are mounted, via an insulator 16 and a washer 17, a plurality of dish springs 18. The dish springs 18 are urged toward the semiconductor element 4. That is, the semiconductor element 4 and cathode lead electrode 15 are held against the aluminum support plate 2 by the dish springs 18. Extending centrally of the dish springs 18 is a guide 19 for guiding the dish springs. An L-shaped cathode lead electrode 20 is secured by a screw 21 to the outer side face of the cathode lead electrode 15. At the outer end of the hole 14, at least one of the confronting surfaces of the electrode 15 and case 5, for instance the confronting surface of the case 5, is provided with a groove 22 surrounding the electrode 15, and an O-ring is received in the groove 22 in an urged state and compressed therein, whereby the hermetical seal of the interior of the case 5 is ensured.

With this power semiconductor device, a predetermined pressure is applied to the cathode lead electrode 15 and semiconductor element 4 via the dish springs 18, while also urging the O-rings 9 and 23, thus maintaining the hermetic seal of the interior of the case 5 to protect the semiconductor element 4.

With this construction, however, when a predetermined pressure is applied to the semiconductor element 4, the deformation of the O-rings 9 and 23 is unbalanced. This results from the cumulative tolerances of the various parts supported in a stacked state on the aluminum support plate 2. Therefore, a predetermined pressure cannot be uniformly applied to the O-rings 9 and 23, so that the hermetic seal cannot be steadily ensured.

SUMMARY OF THE INVENTION

It therefore is an object of the present invention to provide a power seimconductor device having O-rings that can be uniformly deformed to reliably maintain a hermetic seal, irrespective of the cumulative manufacturing tolerances of parts in the device.

According to the invention, there is provided a power semiconductor device, which comprises a support plate also serving as a heat radiator, a compression bonding type semiconductor element structure supported on the support plate and electrically connected thereto, a case provided on the support plate to surround the semiconductor element structure, a lead electrode electrically connected to the compression bonding type semiconductor element structure and led to the outside of the case through a side wall thereof, a spring structure disposed inside the case and urging the lead electrode and compression bonding type semiconductor element structure toward the support plate, a cover member holding the spring structure in a predetermined urged state, an O-ring clamped between the outer surface of a member disposed inside the case and a corresponding inner wall of the case and hermetically sealing a semiconductor element of the semiconductor element structure from external atmosphere, and means for making integral the case, parts accommodated therein and the support plate.

If necessary, a further O-ring may be provided between the inner wall of the lead electrode hole formed in a side wall of the case and the lead electrode in the power semiconductor device according to the invention for maintaining the hermetic seal for the semiconductor element.

It is possible to hermetically seal the support plate and the case provided thereon with an adhesive or the like, and in such a case an O-ring may be further provided between the two to maintain the hermetic seal.

The O-ring may of course be provided in a device in which a plurality of semiconductor element structures is provided inside a case. Further, O-rings may be provided in a plurality of places, if necessary. Furthermore, two or more O-rings may be provided in the same place to enhance the hermetic seal.

The material of the O-ring is usually an elastic insulator such as silicone rubber.

Generally, according to the invention, an O-ring is provided in contact with a spring retainer and an external electrode section (electrode, cooling fin) and the inner wall of the case. A predetermined pressure is applied in a direction substantially parallel to the contact surfaces of the O-ring. Thus, it is possible to obtain uniform deformation of the O-ring and thus ensure that an hermetic seal is maintained irrespective of the tolerances of various parts of the device.

BRIEF DESCRIPTION OF THE DRAWINGS

FIGS. 3 through 11 are sectional views showing various power semiconductor devices according to the invention.

DETAILED DESCRIPTION OF THE PREFERRED EMBODIMENTS

Now, preferred embodiments of the invention will be described with reference to the drawings.

Figure 1:
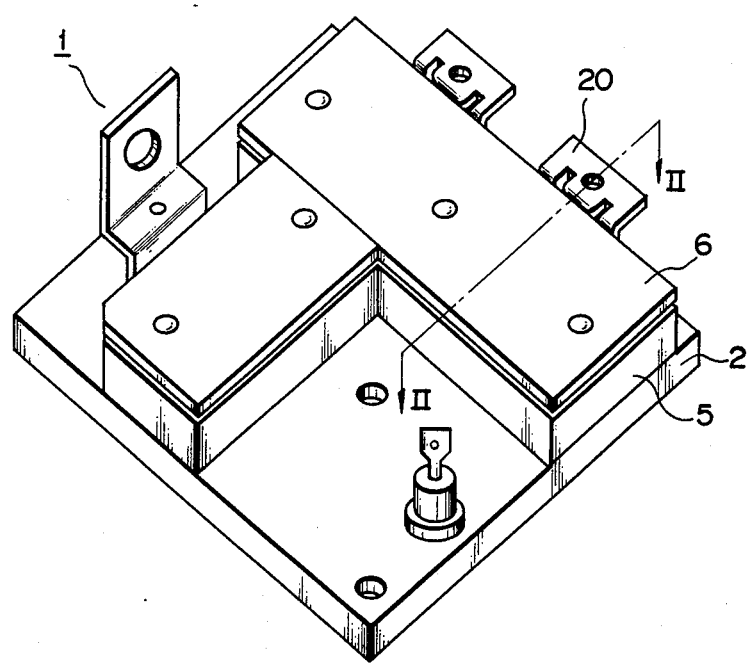
FIG. 1 is a perspective view showing a conventional power semiconductor device.
Figure 2:
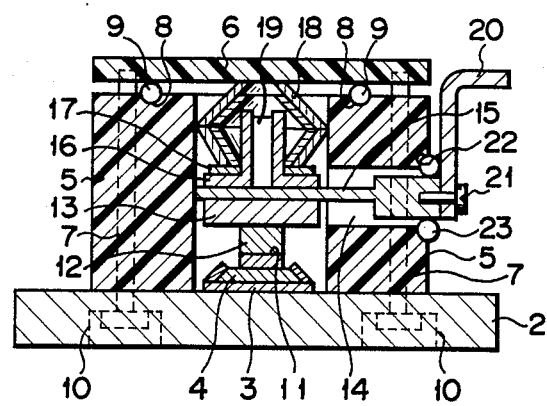
FIG. 2 is a section taken along line II—II in FIG. 1.
Figure 3:
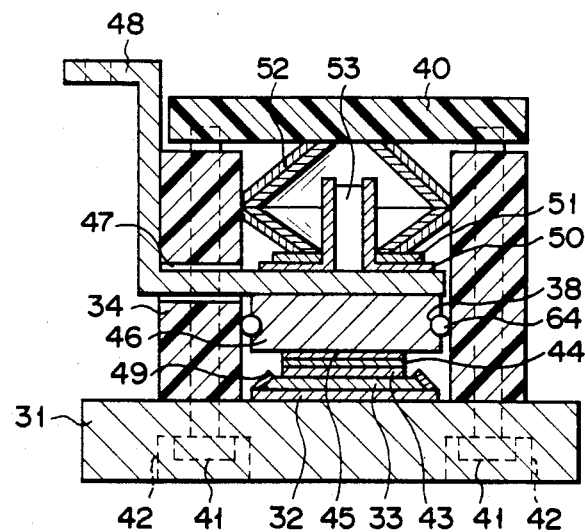

FIG. 3 shows one embodiment of the invention. An aluminum support plate 31, which also serves as a heat radiator, supports a semiconductor element 33 of the forced contact type, for instance a thyristor or a diode, with its anode electrode 32 in contact with the top surface of the support plate 31.

Copper electrodes 45 and 46 are provided over the cathode electrode 43 of the semiconductor element 33 via such metal 44 as molybdenum or tungsten having a coefficient of thermal expansion close to that of the semiconductor element 33. On the electrode 46 is provided an end portion of a cathode lead electrode 48, which is inserted into the case 34 through a hole 47 formed in a side wall thereof. The electrodes 45 and 46 may be constituted by a single electrode. Designated at 49 is an insulator. Mounted on the aforementioned end portion of the cathode lead electrode 48 via an insulator 50 and washer 51 are a plurality of dish springs 52. The dish springs 52 urge the end portion of the cathode lead electrode 48 toward the semiconductor element 33. Extending centrally of the dish springs 52 is a guide 53 for guiding the dish springs.

A case 34 made of an insulating material and open at the top and bottom is secured by adhesive (not shown) to the support plate 31. The case 34 surrounds the semiconductor element structure, which includes the semiconductor element 33, electrodes 45 and 46 and cathode lead electrode, and the spring structure which includes the dish springs 52 and guide 53. A cover plate 40 is provided on top of the case 34. The aluminum support plate 31, case 34 and cover plate 40 are secured to one another by a plurality of screws 41. The support plate 31 is provided with recesses 42 to prevent the screws 41 from projecting from it. To facilitate hermetically sealing the semiconductor element 33, an annular groove 38 is formed on the outer periphery of the electrode 46, and an O-ring 64 is fitted into the groove 38 and urged and compressed between the electrode 46 and the inner wall of the embodiment 34. In this case, the O-ring 64 is deformed uniformly regardless of the direction of pressure application by the screw 41. Thus, it is possible to steadily maintain the hermetic seal, irrespective of the cumulative tolerances of the parts supported on the support plate 31. The space above the cathode lead electrode 48 is not sealed, so that water may intrude into it. Therefore, it is desirable to provide a drain hole in the side wall of the case 34.

Figure 4:
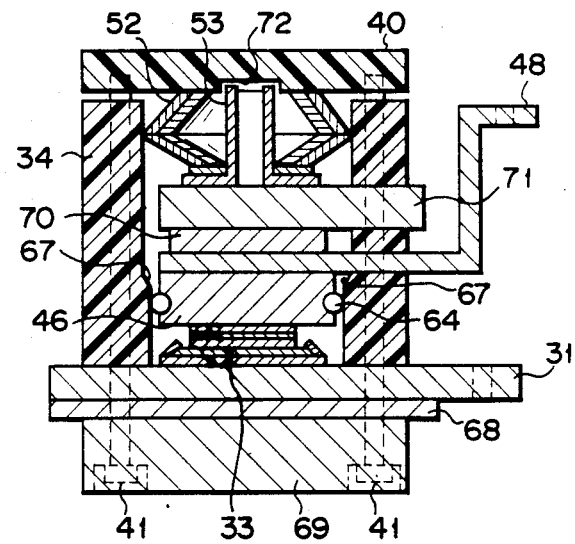

FIG. 4 shows a modification of the embodiment of FIG. 3. In this embodiment, a cooling fin 69 is provided on the underside of aluminum support plate 31 via an insulator 68. Another cooling fin 71 is provided on cathode lead electrode 48 via an insulator 70. Semiconductor element 33 is cooled by cooling fins 69 and 71. In the other respects, the construction is the same as the preceding embodiment of FIG. 3. The cooling fins 69 and 71 may be water cooling fins. However, no problem of electro-corrosion occurs, since the watercooling fins are electrically insulated.

The inner wall of the case 34 in FIG. 4 is provided with a shoulder 67. This reduces the distance of displacement of the contact surfaces of the O-ring 64 and also facilitates the insertion of the O-ring 64. Furthermore, the dish spring guide 53 may have an extended end portion so that its end may be received in a recess 72 formed in the cover plate 40. This arrangement facilitates the positioning of the dish springs 52.

FIGS. 5 and 6 shows further modifications, in which support plate 31 and case 34 are sealed to each other by an O-ring.

In the case of FIG. 5, the aluminum support plate 31 is provided with a projection 78, and an O-ring 79 similar to O-ring 64 is provided between the periphery of the projection 78 and the inner wall of the case 34. In this embodiment, there may be a clearance between the aluminum support plate 31 and the lower end of the case 34.

In the embodiment of FIG. 6, an O-ring 65 is provided between case 34 and the corresponding portion of aluminum support plate 31, and the case 34 is fastened to the support plate 31 from the side thereof by screws 66.

FIG. 7 shows a modification of the construction of FIG. 4. Here, two semiconductor elements 33a and 33b are urged in an overlapped state against the support plate. In this embodiment, three O-rings 59, 64a and 64b are used.

In the preceding embodiments of FIGS. 3 to 7, the hermetic seal for the semiconductor element or elements is provided on the lower side of the cathode lead electrode 48. But it is also possible to provide an hermetic seal for the cathode lead electrode 48 and dish springs 52, as shown in the embodiments of FIGS. 8 through 11.

Figure 8:
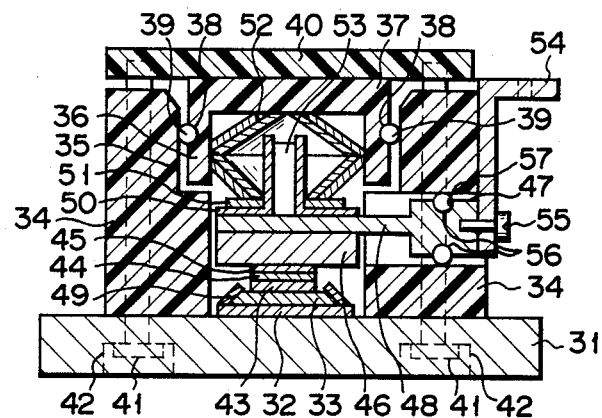

In the embodiment of FIG. 8, the inner wall of a case 34 is provided at an upper position with a shoulder 35. A spring retainer 37 having a projection 36 extending to face the shoulder 35 is provided inside the case 34. At least one of the confronting surfaces of the spring retainer 37 and case 34, here the confronting surface of the spring retainer 37, is provided with an annular groove 38. An O-ring 39, for instance made of an elastic insulating resin, is fitted into the groove 38 and compressed therein.

An L-shaped cathode lead electrode 54 is secured by a screw 55 to the outer side face of the cathode lead electrode 48. In the side hole 47 in the case 34, at least one of the confronting surfaces of the electrode 48 and case 34, here the outer periphery of the electrode 48, is provided with an annular groove 56. An O-ring 57 is fitted into the groove 56 and compressed therein to maintain the hermetic seal of the interior of the case 34. In the other respects, the construction of the FIG. 8 embodiment is the same as the construction shown in FIG. 3, so further description is not necessary.

Figure 9:
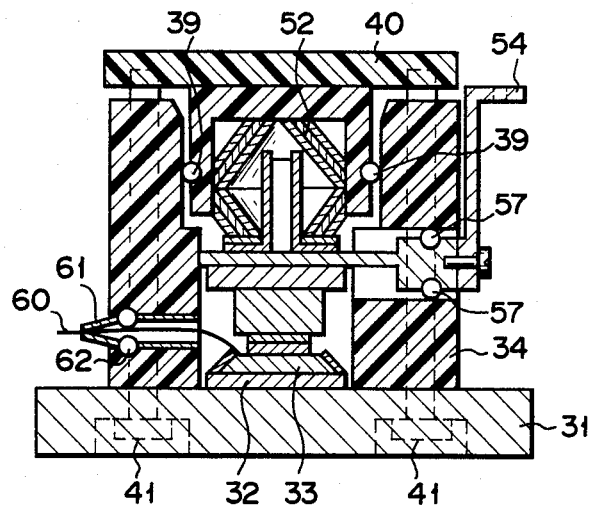

In the embodiment of FIG. 9, a gate electrode 60 of a thyristor is led out to the outside of case while maintaining the hermetic seal thereof. Here, one side wall of the case 34 is provided with a tapped hole, and a hollow metal sleeve 61 having an outer thread is threaded into the tapped hole. In this embodiment, an O-ring 62, similar to the O-ring 57 mentioned above, is provided between the outer periphery of the sleeve 61 and the inner wall of the case 34.

Figure 10:
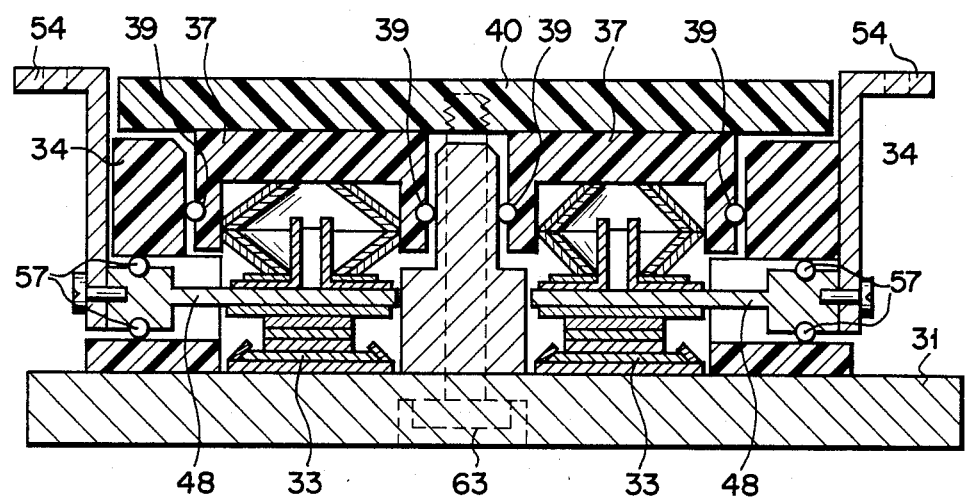

In the embodiment of FIG. 10, two semiconductor elements 33 are urged side by side against aluminum support plate 31 and are clamped by a single screw 63. In the other respects, the construction is the same as the construction of FIG. 8.

Figure 11:
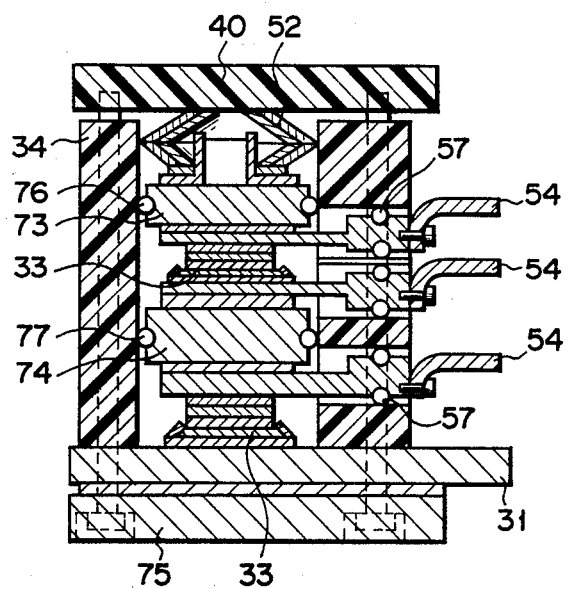

In the embodiment of FIG. 11, electrically insulated cooling fins 73, 74 and 75 are urged toward one another. In this case, O-rings 76 and 77, which are similar to the O-ring 39, are provided between the peripheral wall of the individual cooling fins 73 and 74 and the inner wall of the case 34.

While the above embodiments have been concerned with diodes of two-terminal structure and thyristors of three-terminal structure as the semiconductor element 33, the invention is of course applicable to other semiconductor elements, such as a transistor. Moreover, the O-rings 39, 57, 59, 62, 64, 76 and 77 may be made of a metal instead of an elastic insulator. Furthermore, instead of securing the case 34 by screws, an adhesive may be used to secure the case.

What we claim is:

1. A power semiconductor device comprising a support plate also serving as a heat radiator, a compression bonding type semiconductor element structure supported on said support plate and electrically connected thereto, a case provided on said support plate to surround said semiconductor element structure, a lead electrode electrically connected to said compression bonding type semiconductor element structure and led out to the outside of the case through an aperture in a side wall thereof, a spring structure disposed inside said case and urging said lead electrode and compression bonding type semiconductor element structure toward said support plate, a cover for holding said spring structure in a predetermined biased state, wherein a spacing electrode is provided between said lead electrode and said semiconductor element structure, and wherein said aperture is sized and spaced axially from said semiconductor element structure a distance sufficient to provide an uninterrupted annular portion of the inner wall of said case immediately adjacent the periphery of said electrode, and an O-ring is clamped between the outer periphery of said spacing electrode and the inner wall portion of said case for hermetically sealing a semiconductor element of said semiconductor element structure from the external atmosphere, said O-ring being free to slip under the influence of an urging force of said spring structure, and means for integrating said case, the parts accommodated therein, and said support plate.

2. The power semiconductor device according to claim 1, which further comprises an integral cooling fin.

3. The power semiconductor device according to claim 1, wherein another O-ring is clamped between said support plate and case to provide a hermetic seal between the two.

4. The power semiconductor device according to claim 1, wherein pluralities of semiconductor elements, lead electrodes of the type led out to the outside of the core through respective apertures, and spacing electrodes are provided in a stacked state, and wherein an uninterrupted core inner wall portion is provided adjacent the periphery of each spacing electrode and an O-ring is clamped between each spacing electrode and the respective inner wall portion to provide a hermetic seal for each said semiconductor element.

5. The power semiconductor device according to claim 1, wherein the O-ring is fitted in an annular groove provided in said spacing electrode.

6. A power semiconductor device comprising a support plate also serving as a heat radiator, a compression bonding type semiconductor element structure supported on said support plate and electrically connected thereto, a case provided on said support plate to surround said semiconductor element structure, a lead electrode electrically connected to said compression bonding type semiconductor element structure and led out to the outside of the case through an aperture in a side wall thereof, a spring structure disposed inside said case and urging said lead electrode and compression bonding type semiconductor element structure toward said support plate, a cover for holding said spring structure in a predetermined biased state, a sealing member disposed above said semiconductor element structure inside said case, an O-ring clamped between the outer periphery of said sealing member and the inner wall of said case for hermetically sealing a semiconductor element of said semiconductor element structure from the external atmosphere, said O-ring being free to slip under the influence of an urging force of said spring structure, and means for integrating said case, the parts accommodated therein, and said support plate, wherein said sealing memeber is a spring retainer provided above the lead electrode and another O-ring is provided between the inner wall of a hole formed in a side wall of the case for leading out the lead electrode and said lead electrode.

7. The power semiconductor device according to claim 6, wherein a side wall of the case is formed with a see-through hole penetrated by a hollow metal sleeve, and an O-ring for hermetically sealing a semiconductor element of said semiconductor element structure from the external atmosphere is provided between the inner wall of said see-through hole and the outer periphery of said metal sleeve.

8. The power semiconductor device according to claim 6, wherein a plurality of semiconductor elements are provided side by side inside the case, and O-rings are clamped between an outer periphery of said spring retainer and an inner wall of the case and also between the hole in the inner wall and the lead electrode for hermetically sealing the individual semiconductor elements.

9. The power semiconductor device according to claim 6, werein the O-rings are fitted in annular grooves provided in said spring retainer.

10. The power semiconductor device according to claim 9 wherein a plurality of semiconductor elements are disposed in a stacked state inside the case, and O-rings are clamped between said electrode provided over each of the semiconductor elements and the inner wall of the case and also between the inner wall of the case and the outer periphery of the lead electrode for each semiconductor element.

11. The power semiconductor device according to claim 6, which further comprises an integral cooling fin.

* * * * *

UNITED STATES PATENT AND TRADEMARK OFFICE
CERTIFICATE OF CORRECTION

PATENT NO. : 4,609,937

DATED : September 2, 1986

INVENTOR(S) : Minami Takeuchi et al.

It is certified that error appears in the above-identified patent and that said Letters Patent is hereby corrected as shown below:

On the Title Page, after "(76) Inventors: Minami Takeuchi, 3-19-6, Fujimidai, Nerima-ku, Tokyo; Shuichi Otake, 2-16-9, Miyoshi, Koto-ku, Tokyo, both of Japan" insert a new paragraph --Assignee: Tokyo Shibaura Denki Kabushiki Kaisha, Kawasaki, Japan--;

On the Title Page, after "(22) Filed: Apr. 26, 1985" insert a new paragraph --Parent Application S.N. 381,763 Abandoned--.

Signed and Sealed this

Seventeenth Day of February, 1987

Attest:

DONALD J. QUIGG

Attesting Officer

Commissioner of Patents and Trademarks